US012604460B2

(12) United States Patent
Hong et al.

(10) Patent No.: US 12,604,460 B2
(45) Date of Patent: Apr. 14, 2026

(54) SEMICONDUCTOR MEMORY DEVICE

(71) Applicant: Fujian Jinhua Integrated Circuit Co., Ltd., Quanzhou City (CN)

(72) Inventors: Yincong Hong, Quanzhou City (CN); Chia-Hung Wang, Quanzhou City (CN); Yue Liu, Quanzhou City (CN); Chung-Ping Hsia, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 656 days.

(21) Appl. No.: 18/088,642

(22) Filed: Dec. 26, 2022

(65) Prior Publication Data

US 2024/0057310 A1 Feb. 15, 2024

(30) Foreign Application Priority Data

Aug. 12, 2022 (CN) .......................... 202210968713.1
Aug. 12, 2022 (CN) .......................... 202222130424.2

(51) Int. Cl.
H10B 12/10 (2023.01)
H10B 12/00 (2023.01)
(52) U.S. Cl.
CPC ........... H10B 12/315 (2023.02); H10B 12/50 (2023.02)

(58) Field of Classification Search
CPC .... H10B 12/315; H10B 12/50; H10B 12/033; H10B 12/09; H10D 1/716
See application file for complete search history.

(56) References Cited

U.S. PATENT DOCUMENTS 8,816,418 B2 8/2014 Kim
2013/0052785 A1* 2/2013 Mashiko .............. H10B 12/033
438/700

FOREIGN PATENT DOCUMENTS

CN 108428702 A * 8/2018 ............. H10B 43/30
CN 207852675 U * 9/2018

* cited by examiner

*Primary Examiner* — Samuel Park
(74) *Attorney, Agent, or Firm* — Winston Hsu

(57) ABSTRACT

A semiconductor memory device includes a substrate, and a plurality of contact pads and a capacitor array structure disposed on an array region of the substrate. The capacitor array structure includes a plurality of capacitors respectively disposed on the contact pads and a middle supporting layer extending laterally between waist portions of the capacitors to define an upper portion and a lower portion of each of the capacitors. The lower portions of the capacitors near the edge of the array region are tilted. The upper portions of the capacitors near the edge of the array region have misalignments to the contact pads. The stress in the capacitor array structure of the semiconductor memory device may be reduced.

24 Claims, 10 Drawing Sheets

SEMICONDUCTOR MEMORY DEVICE

BACKGROUND OF THE INVENTION

1. Field of the Invention

The present invention relates to a semiconductor memory device. More particularly, the present invention relates to a semiconductor memory device including memory cells with stacked capacitors.

2. Description of the Prior Art

A dynamic random access memory (DRAM) device is a kind of volatile memory. A DRAM device usually includes a memory region including an array of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In recently years, high-density and high integrity DRAM devices with larger storage capacities are earnestly required in the industry to produce smaller and advanced electronic products. 3D memory cells have been proposed in the field to meet the above requirements by forming capacitors stacked on the substrate and above the transistors or buried in trenches in the substrate, wherein stacked capacitor cells have become the mainstream because the capacitances of stacked capacitors may be increased for a better device performance by simply increasing the vertical heights of the stacked capacitors. However, the stacked capacitors have problems need to be solved, such as structural damages and degraded reliability due to their higher susceptibility to stress impact.

SUMMARY OF THE INVENTION

One objective of the present invention is to provide a semiconductor memory device including a capacitor array structure formed by plurality of stacked capacitors. The stacked capacitors near the sidewall of the capacitor array structure are fabricated to be at least partially tilted to alleviate the stress in the capacitor array structure and improve the overall stress state of the semiconductor memory device. Accordingly, stress-induced damages in the capacitor array structure may be reduced and better device reliability may be obtained.

One embodiment of the present invention provides a semiconductor memory device including a substrate comprising at least an array region, a peripheral region bordering an edge of the array region, a plurality of contact pads disposed on the array region, and a capacitor array structure disposed on the array region. The capacitor array structure includes a plurality of capacitors respectively disposed on the contact pads, and a middle supporting layer extending laterally between waist portions of the capacitors to define an upper portion and a lower portion of each of the capacitors. The lower portions of the capacitors near the edge of the array region are tilted, and the upper portions of the capacitors near the edge of the array region have misalignments to the contact pads.

Another embodiment of the present invention provides a semiconductor memory device including a substrate comprising at least an array region, a peripheral region bordering an edge of the array region, a plurality of contact pads disposed on the array region, and a capacitor array structure disposed on the array region. The capacitor array structure includes a plurality of capacitors respectively disposed on the contact pads, and a middle supporting layer extending laterally between waist portions of the capacitors to define an upper portion and a lower portion of each of the capacitors. The upper portions of the capacitors near the edge of the array region are tilted and have misalignments to the contact pads.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
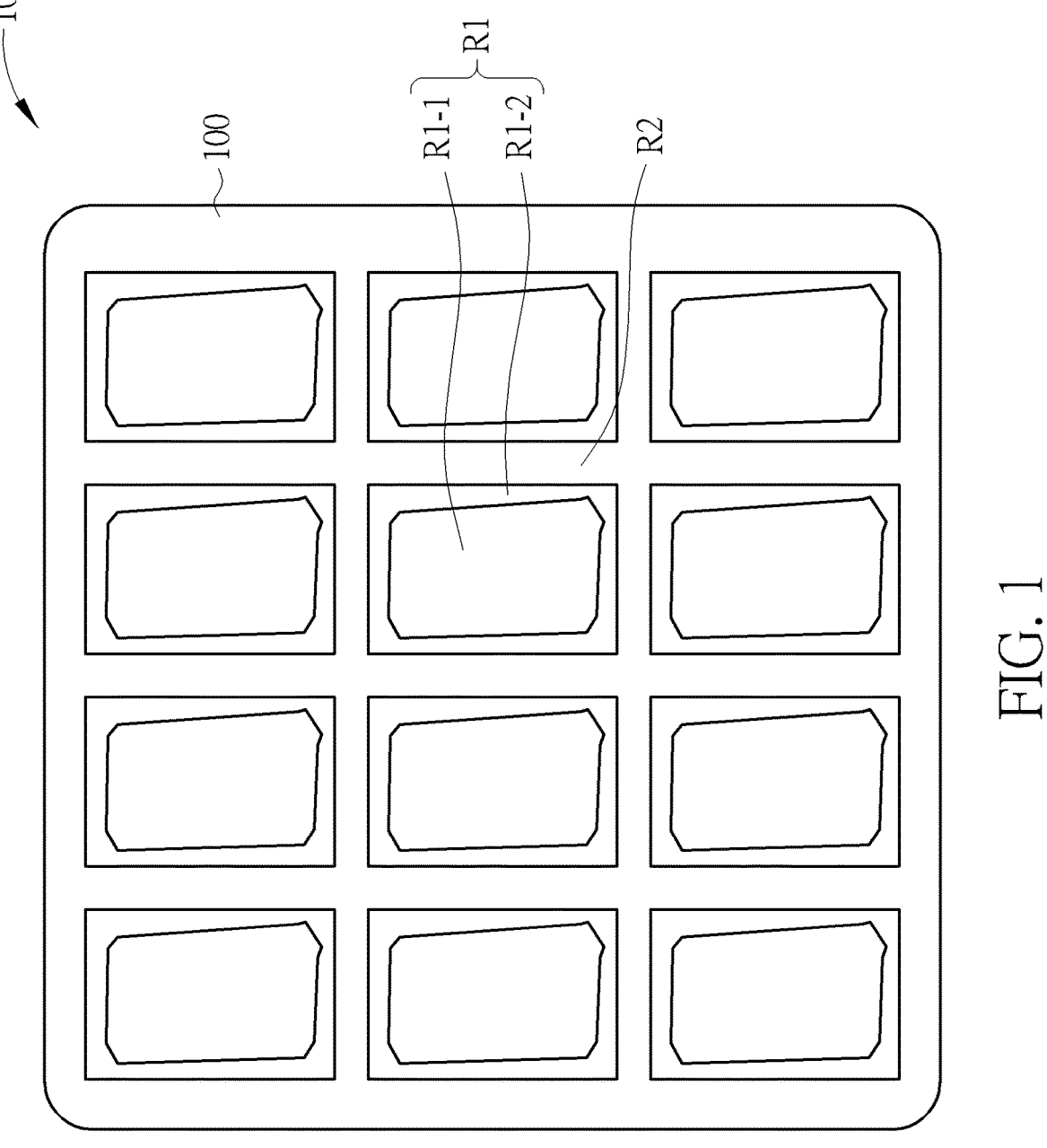
FIG. 1 is a schematic drawing illustrating a plan view of a portion of a semiconductor memory device according to an embodiment of the present invention.

Please refer to FIG. 1, which is a schematic drawing illustrating a plan view of a memory bank region of a semiconductor memory device 10 according to an embodiment of the present invention. The semiconductor memory device 10 includes a substrate 100. A plurality of array regions R1 and a peripheral region R2 between the array regions R1 are defined in the substrate 100. Each array region R1 is a memory array tile (MAT) region and may include an active array region R1-1 where the active memory cells are disposed and a dummy array region R1-2 where the dummy memory cells are disposed. The dummy array region R1-2 is located between the active array region R1-1 and the peripheral region R2 and surrounds the active array region R1-1. The peripheral region R2 borders the edge of the array regions R1. The peripheral region R2 may include logic devices such as local row decoders or local sense amplifier that control the read, write or erase operations of the memory cells in the array region R1.

Figure 2:
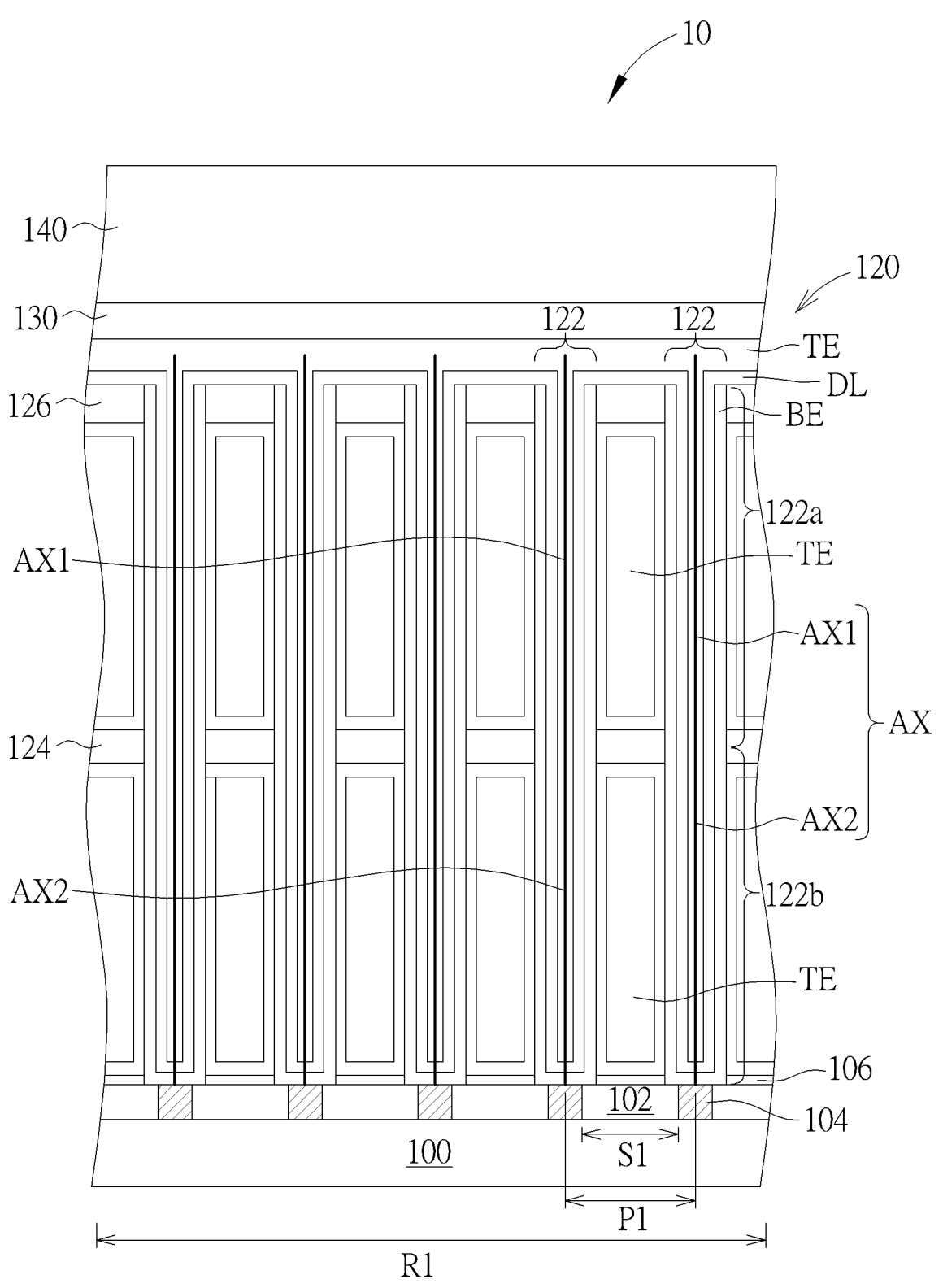
FIG. 2 is a schematic drawing illustrating a partial cross-sectional view of the semiconductor memory device shown in FIG. 1.

Please refer to FIG. 2, which is a schematic drawing illustrating a partial cross-sectional view of the semiconductor memory device 10 as shown in FIG. 1. The semiconductor memory device 10 includes memory cells with stacked capacitors 122 that are arranged to form a capacitor array structure 120 disposed on the array regions R1 of the substrate 100. An insulating capping layer 130 is formed on the substrate 100 and covers the capacitor array structure 120. A planarization layer 140 is formed on the capping layer 130. The substrate 100 may be a silicon substrate, an epitaxial silicon substrate, a silicon germanium (SiGe) substrate, a silicon carbide (SiC) substrate, or a silicon-on-insulator (SOI) substrate, but is not limited thereto. The transistors (not shown) of the memory cells such as n-type metal oxide semiconductor transistors are formed in the array regions R1 of the substrate 100. A plurality of word lines (not shown) and bit lines (not shown) may be formed in the substrate 100 or in a dielectric layer (not shown) on the substrate 100 to control read, write or erase operations of the memory cells.

As shown in FIG. 2, the semiconductor memory device 10 further includes an interlayer dielectric layer 102 disposed between the substrate 100 and the capacitor array structure 120. A plurality of contact pads 104 are disposed in the interlayer dielectric layer 102 to electrically connect the capacitors 122 of the capacitor array structure 120 to the associated transistors in the substrate 100. The interlayer dielectric layer 102 may include a dielectric material, such as silicon oxide ($SiO_2$), silicon nitride (SiN), silicon oxynitride (SiON), silicon carbon nitride (SiCN), high-k dielectric material, or a combination thereof, but is not limited thereto. According to an embodiment of the present invention, the interlayer dielectric layer 102 includes silicon nitride (SiN). The contact pads 104 may include a conductive material, such as a metal including tungsten (W), copper (Cu), aluminum (Al), titanium (Ti), tantalum (Ta), a compound, alloy or composite layer of the above metal materials, but is not limited thereto. According to an embodiment of the present invention, the contact pads 104 include tungsten (W). The contact pads 104 are arranged at a constant pitch P1, wherein the pitch P1 is defined as the distance between centers of adjacent contact pads 104. The sidewalls of adjacent contact pads 104 may be equally spaced by a space S1.

The capacitor array structure 120 includes a plurality of bottom electrodes BE respectively and directly disposed on the contact pads 104. A capacitor dielectric layer DL if formed conformally along the sidewalls of the bottom electrodes BE. A top electrode TE is formed on the capacitor dielectric layers DL and fills the spaces between the bottom electrodes BE. An etching stop layer 106 may be disposed between the interlayer dielectric layer 102 and the capacitor array structure 120. The bottom electrodes BE extend through the etching stop layer 106 to directly contact the contact pads 104 and be electrically connected to the associated transistors (not shown) of the memory cells. Each bottom electrode BE is capacitive coupled to the top electrode TE through the capacitor dielectric layer DL to form a capacitor 122, and may be referred to as a storage node (SN) of the memory cell. The etching stop layer 106 may include a dielectric material, such as silicon nitride (SiN), silicon carbide (SiC), silicon carbon nitride (SiCN), nitride doped silicon carbide (NDC), or a combination thereof, but is not limited thereto. The bottom electrodes BE and the top electrode TE may respectively include a conductive material, such as a metal including tungsten (W), copper (Cu), aluminum (Al), titanium (Ti), tantalum (Ta), a compound, alloy or composite layer of the above metal materials, but is not limited thereto. The capacitor dielectric layer DL may include a dielectric material, such as silicon oxide ($SiO_2$), silicon nitride (SiN), or a high-k dielectric material, but is not limited thereto. In this embodiment, the bottom electrodes BE may respectively have a hollow cylindrical shape with a closed bottom end. The inner sidewall of the bottom electrodes BE are also covered by the capacitor dielectric layer DL, and the remaining spaces between the inner sidewalls are filled by the top electrode TE. In this way, the capacitive coupling areas between each bottom electrode BE and the top electrode TE may be increased to provide a larger capacitance. It should be understood that in other embodiments of the present invention, each of the bottom electrodes BE may be formed with a hollow cylindrical shape having an open bottom end, or may be formed into a solid cylindrical pillar, but is not limited thereto.

As shown in FIG. 2, the capacitor array structure 120 further includes a middle supporting layer 124 extending laterally and connected between the waist portions of the bottom electrodes BE (that is, the waist portions of the capacitors 122). The middle supporting layer 124 may provide structural support to the bottom electrodes BE to prevent collapse during the fabrication process. Defined by the middle supporting layer 124, each capacitor 122 may be divided into an upper portion 122*a* above the middle supporting layer 124 and a lower portion 122*b* below the middle supporting layer 124. In some embodiments, the capacitor array structure 120 further includes an upper supporting layer 126 extending laterally and connected between the top portions of the bottom electrodes BE to further ensure sufficient structural support for the capacitors 122. The materials of the middle supporting layer 124 and the upper supporting layer 126 may include silicon nitride (SiN), silicon carbide (SiC), silicon carbon nitride (SiCN), nitride doped silicon carbide (NDC), but is not limited thereto. The materials of the middle supporting layer 124 and the upper supporting layer 126 may be the same or different.

Each capacitor 122 may include a virtual axial line AX that extends through the entire height of the capacitor 122 along the axial center of the bottom electrode BE of the capacitor 122. When the bottom electrode BE is straight upward from the contact pad 104 without bending, the axial line AX of the capacitor 122 is substantially a straight line.

The axial line AX may be divided into an upper axial line AX1 along the upper portion 122a of the capacitor 122 and a lower axial line AX2 along the lower portion 122b of the capacitor 122. In preferred embodiments, the lower axial line of each capacitor 122 is vertically aligned to the center of the associated contact pad 104, so that a larger contacting area between the bottom electrode BE and the contact pad 104 and therefore a reduced contact resistance may be obtained.

Figure 4:
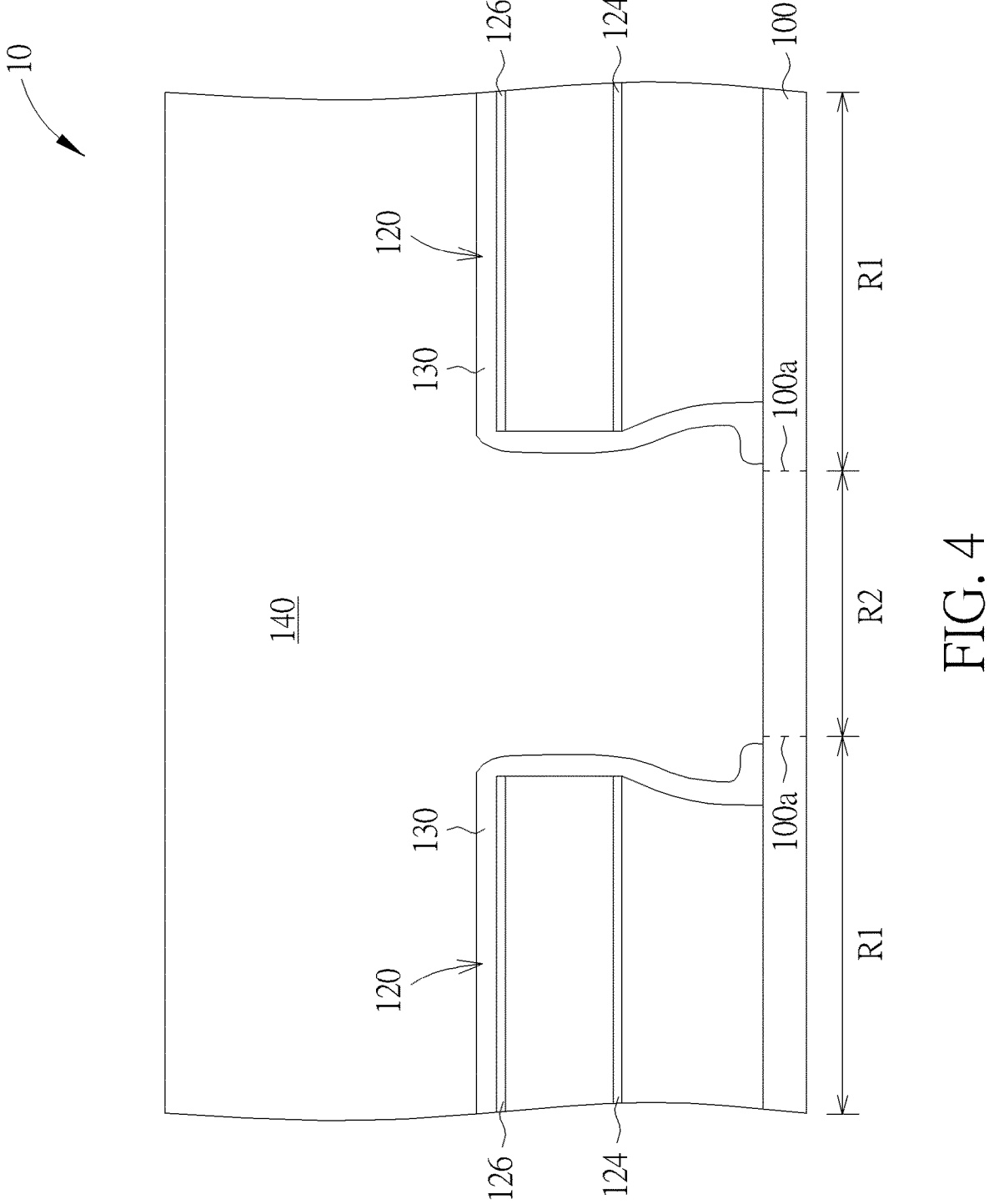
FIG. 4 is schematic drawing illustrating a zoom out cross-sectional view of the semiconductor memory device as shown in FIG. 3.

The capping layer 130 covers on the top surface and sidewalls of the capacitor array structure 120 in a conformal manner (as shown in FIG. 4). The material of the capping layer 130 may include silicon oxide ($SiO_2$), silicon nitride (SiN), or silicon oxynitride (SiON), but is not limited thereto. The capping layer 130 may electrically isolate the capacitor array structure 120 and protect the capacitor array structure 120 from being damaged during subsequent manufacturing process. In some embodiments, the capping layer 130 may be used as an etching stop layer when forming the top electrode contact plugs (not shown). The planarization layer 140 is formed on the capping layer 130 and covers the substrate 100 and the capacitor array structure 120 in a blanket manner. As the semiconductor device 10 includes a plurality of capacitor array structures 120 respectively disposed on the array regions R1 (as shown in FIG. 1), the planarization layer 140 may completely fill the spaces (corresponding to the peripheral region R2) between the capacitor array structures 120 to planarize the topography between the array regions R1 and the peripheral region R2 (as shown in FIG. 4). The planarization layer 140 may include a dielectric material such as silicon oxide ($SiO_2$), undoped silica glass (USG), boron doped silica glass (BSG), boron phosphorus doped silica glass (BPSG), fluorine doped silica glass (FSG), silicon oxycarbide (SiOC) or an organic dielectric layer (ODL), but is not limited thereto.

The fabrication process of the capacitor array structure 120 may include the following process. First, a series of deposition processes are performed to form a layer stack on the substrate 100. The layer stack may include, from the bottom to the top, the etching stop layer 106, a sacrificial layer, the middle supporting layer 124, another sacrificial layer, and the upper supporting layer 126. Subsequently, an etching process is performed to form an array of bottom electrode openings in the layer stack. The bottom electrode holes extending through the entire thickness of the layer stack to expose the contact pads 104. Following, a deposition process is performed to form a conductive layer along the sidewall and bottom surface of each of the bottom electrode holes, thereby forming the bottom electrodes BE having a hollow cylindrical-shaped. Following, patterning and etching processes are performed to define the pattern of the capacitor array structure 120 by removing portions of the layer stack not on the array region R1, and form lateral-extending cavities between the etching stop layer 106, the middle supporting layer 124, and the upper supporting layer 126 to expose sidewalls of the bottom electrodes BE by forming openings in the upper supporting layer 126 and the middle supporting layer 124 and removing the sacrificial layers through the openings. After that, a deposition process is performed to form the capacitor dielectric layer DL along the inner and outer sidewalls of the bottom electrodes BE, and then another deposition process is performed to form the top electrode TE on the capacitor dielectric layer DL and completely filling the cavities between the etching stop layer 106, the middle supporting layer 124, and the upper supporting layer 126, and the remaining spaces of the bottom electrode holes. Optionally, after forming the top electrode TE, an anneal process may be performed to reduce the resistances of the top electrode TE. After removing unnecessary portions of the top electrode TE, the capping layer 130 and the planarization layer 140 are then formed on the substrate 100 and cover the capacitor array structures 120.

In some embodiments, the planarization layer 140 (especially the portion filled between adjacent capacitor array structures 120) may buffer or adjust the stress in the substrate 100 and the capacitor array structures 120. In some embodiments, part of the capacitors 122 near the sidewall of the capacitor array structures 120 (such as capacitors 122 disposed on the dummy array regions R1-2) may be fabricated to be at least partially tilted to produce a tilted sidewall of the capacitor array structure 120. Accordingly, the shape of the portion of the planarization layer 140 filled between the sidewalls of adjacent capacitor array structures 120 may be changed as desired to provide a further improved stress state of the semiconductor memory device 10. The stress in the capacitor array structure 120 may be reduced and better device reliability may be achieved.

In the following description, some embodiments are provided to help those skilled in the art understand the technical features of the present invention. For the sake of simplicity, the capacitors 122 of the capacitor array structure 120 are represented by the axial lines AX of the capacitors 122, wherein and an upright straight axial line AX means a capacitor with an upright straight shape, and a bending axial line (such as AXa, AXb, AXc and AXd) means a capacitor 122 with a bending shape. Other components of the capacitor array structure 120 such as the bottom electrodes BE, the top electrode TE and the capacitor dielectric layer DL as shown in FIG. 2 are also omitted in the following description and drawings.

Figure 3:
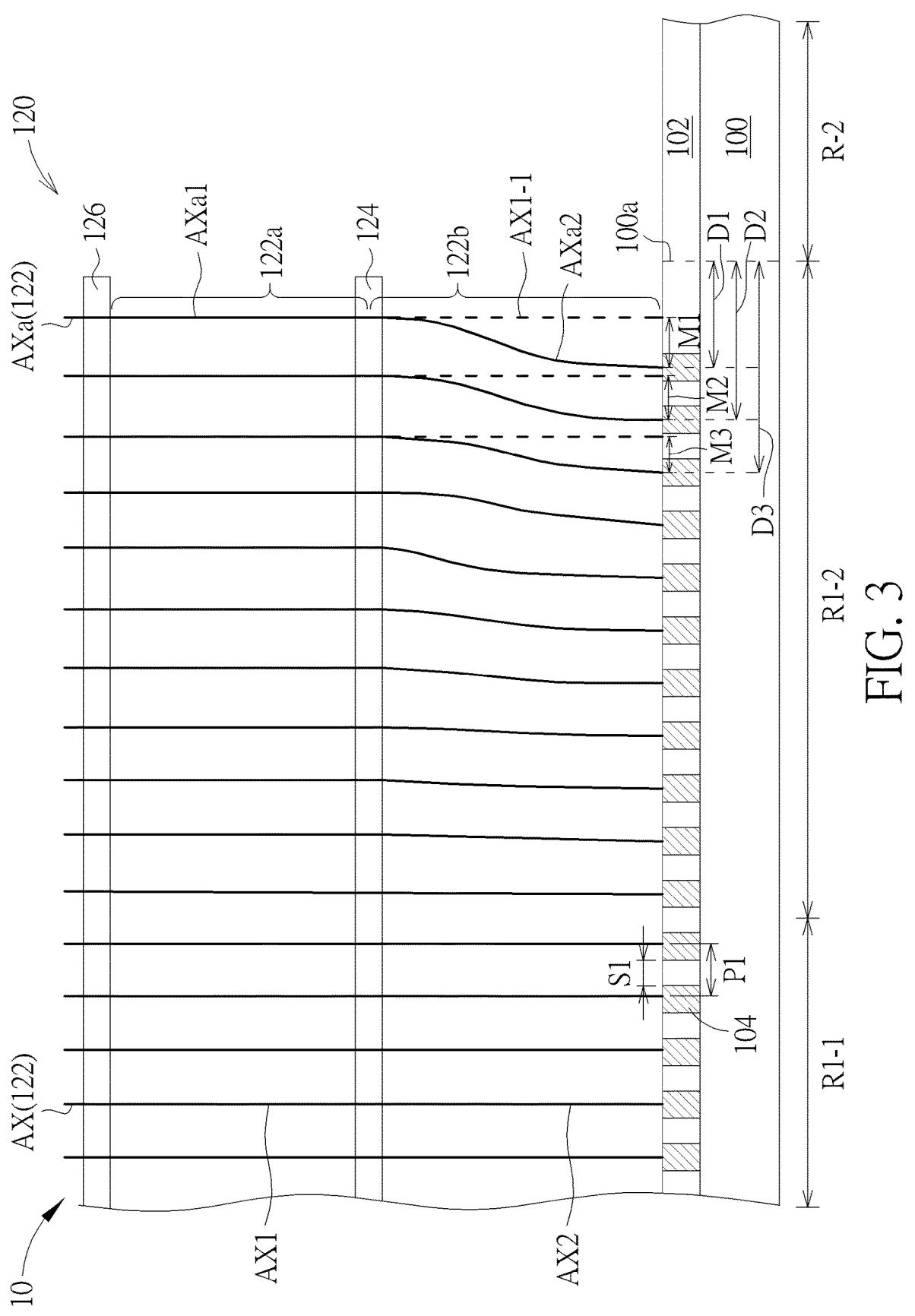
FIG. 3 is a schematic drawing illustrating a partial cross-sectional view of a semiconductor memory device according to an embodiment of the present invention.

Please refer to FIG. 3, which is a schematic drawing illustrating a partial cross-sectional view of a semiconductor memory device 10 according to an embodiment of the present invention. The semiconductor memory device 10 includes a substrate 100 having at least an array region R1 and a peripheral region R2 bordering an edge of the array region R1. An interlayer dielectric layer 102 is formed on the upper surface of the substrate 100. A plurality of contact pads 104 are disposed in the interlayer dielectric layer 102. The contact pads 104 are arranged at a constant pitch P1, wherein the pitch P1 is defined as the distance between centers of adjacent contact pads 104. The sidewalls of adjacent contact pads 104 are equally spaced by a space S 1. A capacitor array structure 120 is disposed on the interlayer dielectric layer 102 on the array region R1, wherein the capacitors 122 of the capacitor array structure 120 are respectively disposed on and electrically connected to the contact pads 104. A middle supporting layer 124 extends laterally and connected between the waist portions of the capacitors 122. An upper supporting layer 126 extends laterally and connected between the top portions of the capacitors 122. In some embodiments, the middle supporting layer 124 and the upper supporting layer 126 may be made of a same material and have the same tensile stress to the substrate 100 along the horizontal direction from the inside of the array region R1 to the peripheral region R2. The tensile stress may cause some of the capacitors 122 near the peripheral region R2 (such as the capacitors 122 on the dummy array region R1-2) bending and respectively having a bending axial lines AXa. More particularly, as shown in FIG. 3, the lower portions 122b of the capacitors 122 near the peripheral region R2 may lean toward the peripheral region R2 and respectively have a bending lower axial line AXa2 with a curved profile. The upper portions 122a of the capacitors 122 may maintain approximately upright vertical and have straight upper axial lines AXa1 that are perpendicular to the surface of the substrate 100, but the extending lines AX1-1 along the upper axial lines AXa1 may misaligned from the associated contact pads 104. In some embodiments, the tensile stress may increase as closer to the edge 100*a* of the array region R1, and the distances of the misalignments of the extending lines AX1-1 from the contact pads 104 may increase as the tensile stress increases. For example, as shown in FIG. 3, the distances between the three outermost contact pads 104 and the edge 100*a* of the array region R1 are D1, D2 and D3, and the distances of the misalignments between the extending lines AX1-1 along the upper axial lines AXa1 of the capacitors 122 on the three contact pads 104 near the peripheral region R2 are M1, M2, and M3, wherein M1 is larger than M2, and M2 is larger than M3. In some embodiments, the distance M1 is smaller than the pitch P1 of the contact pads 104 and larger than ½ of the space S1 between sidewalls of adjacent contact pads 104. In some embodiments, the distance M1 is smaller than the pitch P1 of the contact pads 104 and larger than the space S1 between sidewalls of adjacent contact pads 104.

Please refer to FIG. 4, which is schematic drawing illustrating a zoom out cross-sectional view of the semiconductor memory device 10 as shown in FIG. 3. The substrate 100 may include at least two array regions R1 spaced apart by the peripheral region R2. Two capacitor array structures 120 are respectively disposed on the array regions R1. The capping layer 130 covers top surfaces and sidewalls of the capacitor array structures 120, and extends to cover a portion of the substrate 100. The planarization layer 140 covers the substrate 100, the capacitor array structures 120, and the capping layer 130 in a blanket manner and completely fills the space between the capacitor array structures 120. Due to bending of the capacitors 122 on the dummy array region R1-2 (as shown in FIG. 3), the capacitor array structures 120 have tilted sidewalls that lean inwardly from tops to bottoms of the capacitor array structures 120, so that the portion of the planarization layer 140 filled between the capacitor array structures 120 may have a trapezoid cross-sectional profile.

Figure 5:
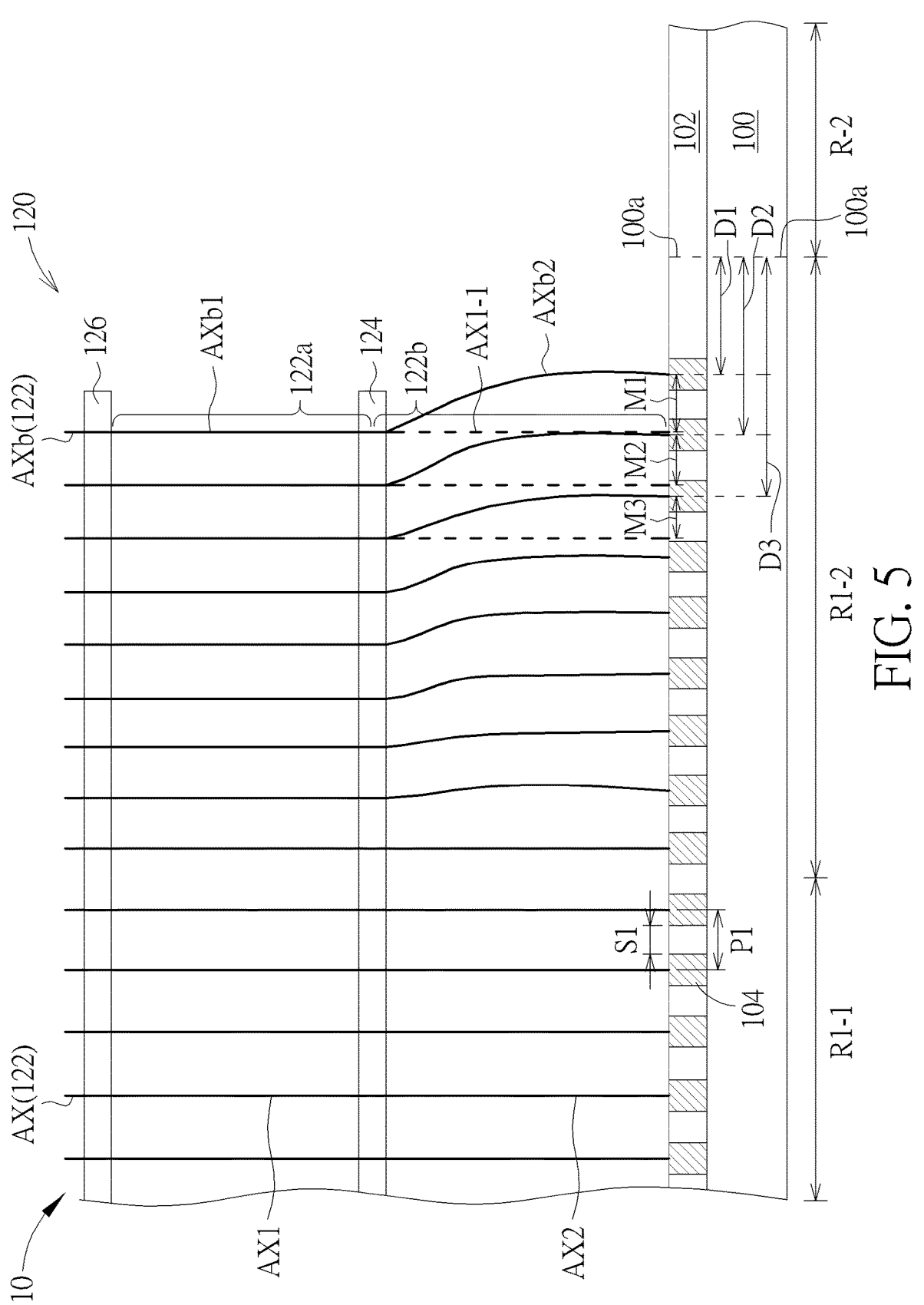
FIG. 5 is a schematic drawing illustrating a partial cross-sectional view of a semiconductor memory device according to an embodiment of the present invention.
Figure 6:
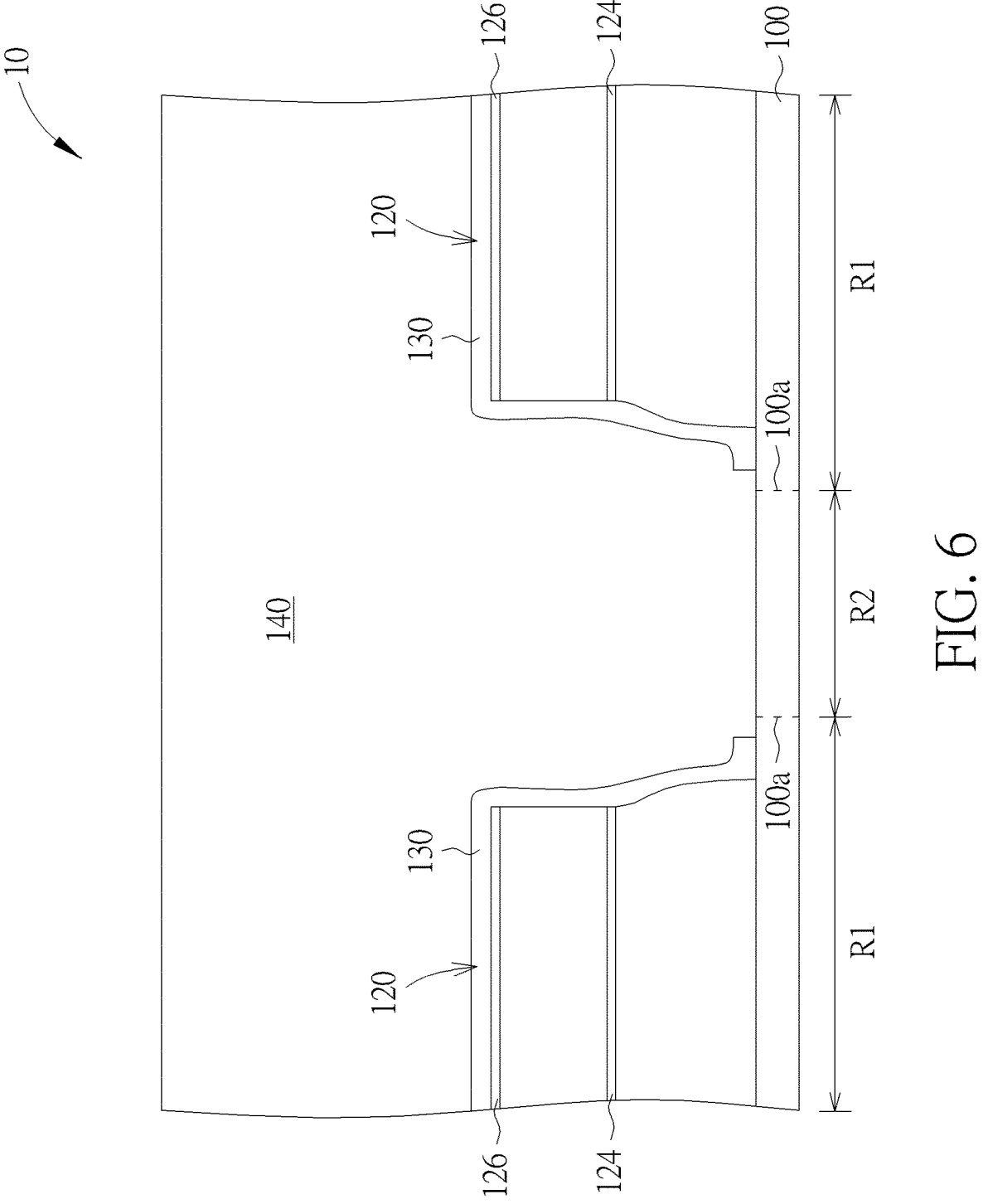
FIG. 6 is schematic drawing illustrating a zoom out cross-sectional view of the semiconductor memory device as shown in FIG. 5.

Please refer to FIG. 5 and FIG. 6. FIG. 5 is a schematic drawing illustrating a partial cross-sectional view of a semiconductor memory device 10 according to an embodiment of the present invention. FIG. 6 is schematic drawing illustrating a zoom out cross-sectional view of the semiconductor memory device 10 as shown in FIG. 5. The upper supporting layer 126 of the semiconductor memory device 10 shown in FIG. 5 and FIG. 6 may be made of a same material. However, different from the embodiment shown in FIG. 3 and FIG. 4, the middle supporting layer 124 and the upper supporting layer 126 of the semiconductor memory device 10 shown in FIG. 5 and FIG. 6 may have a same compressive stress to the substrate 100 along the horizontal direction from the inside of the array region R1 to the peripheral region R2. The compressive stress may cause some of the capacitors 122 near the peripheral region R2 (such as the capacitors 122 on the dummy array region R1-2) bending and respectively having a bending axial lines AXb. More particularly, as shown in FIG. 5, the lower portions 122*b* of the capacitors 122 near the peripheral region R2 may lean toward the inner side of the array region R1, while the upper portions 122*a* may maintain approximately upright vertical to the surface of the substrate 100. The lower axial lines AXb2 of the capacitors 122 near the peripheral region R2 are bending and respectively have a curved profile, while the upper axial lines AXb1 of the bending capacitors 122 are straight and respectively have a linear profile. The extending lines AX1-1 along the upper axial lines AXb1 are misaligned from the associated contact pad 104. In some embodiments, the compressive stress may increase as closer to the edge 100*a* of the array region R1, and the distances of the misalignments of the extending lines AX1-1 from the contact pad 104 may increase as the compressive stress increases. For example, as shown in FIG. 5, the distances between the three outermost contact pads 104 and the edge 100*a* of the array region R1 are D1, D2 and D3, and the distances of the misalignments between the extending lines AX1-1 along the upper axial lines AXb1 of the bending capacitors 122 on the three contact pads 104 are M1, M2, and M3, wherein M1 is larger than M2, and M2 is larger than M3. In some embodiments, the distance M1 is smaller than the pitch P1 of the contact pads 104 and larger than ½ of the space S1 between sidewalls of adjacent contact pads 104. In some embodiments, the distance M1 is smaller than the pitch P1 of the contact pads 104 and larger than the space S1 between sidewalls of adjacent contact pads 104. As shown in FIG. 6, the capacitor array structures 120 have tilted sidewalls that lean outwardly from tops to bottoms of the capacitor array structures 120, so that the portion of the planarization layer 140 filled between the capacitor array structures 120 may have an upside-down trapezoid cross-sectional profile.

Figure 7:
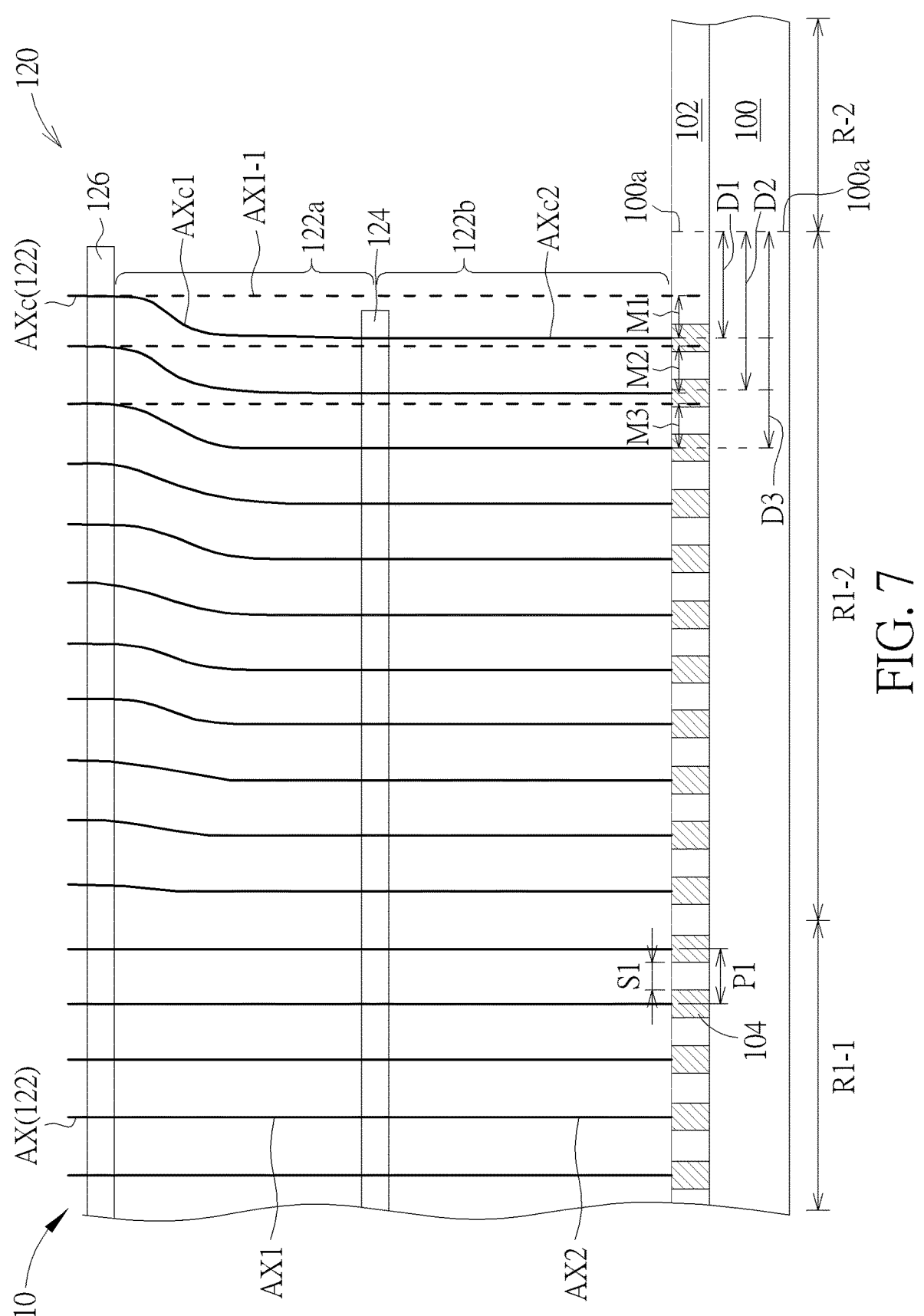
FIG. 7 is a schematic drawing illustrating a partial cross-sectional view of a semiconductor memory device according to an embodiment of the present invention.
Figure 8:
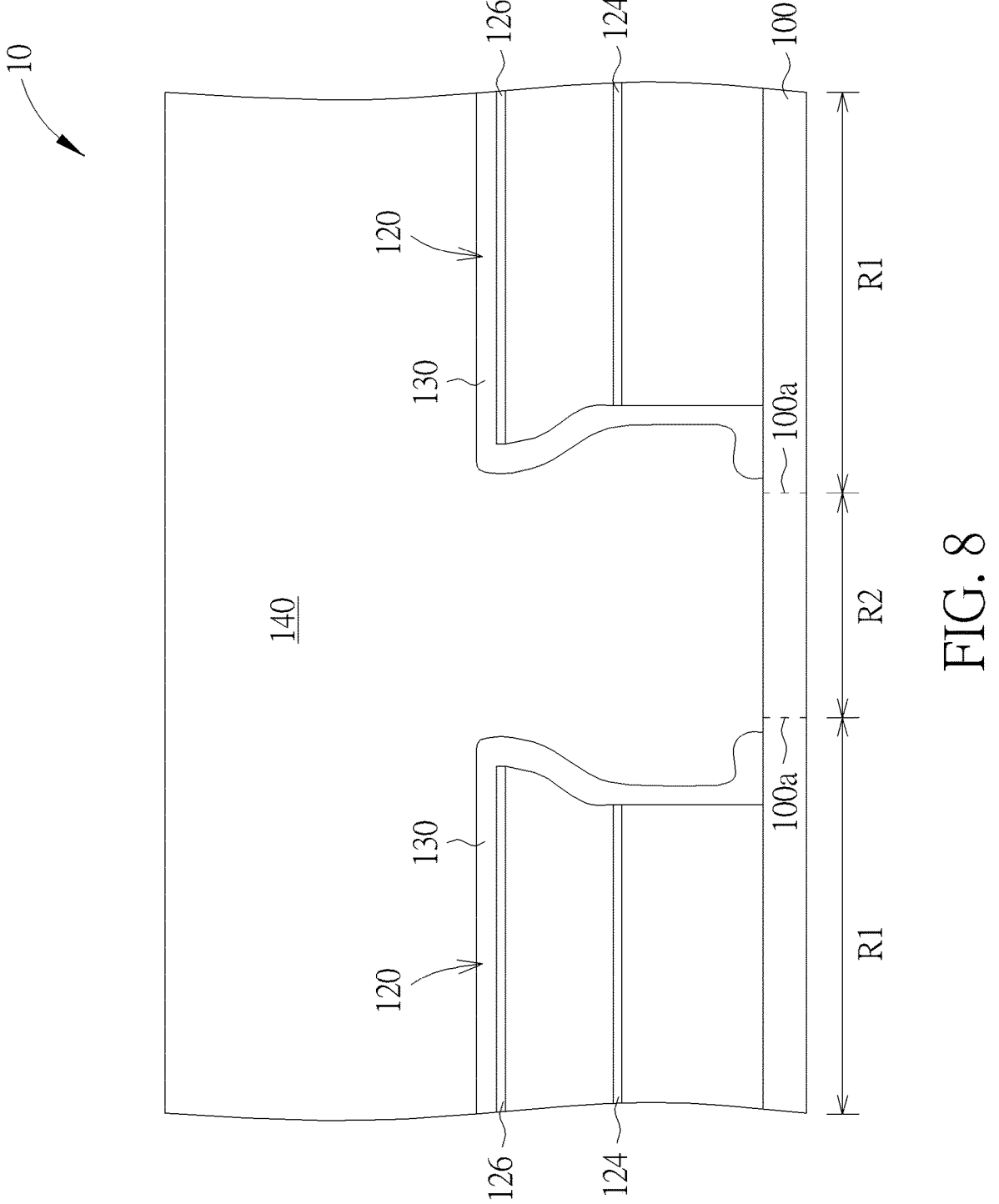
FIG. 8 is schematic drawing illustrating a zoom out cross-sectional view of the semiconductor memory device as shown in FIG. 7.

Please refer to FIG. 7 and FIG. 8. FIG. 7 is a schematic drawing illustrating a partial cross-sectional view of a semiconductor memory device 10 according to an embodiment of the present invention. FIG. 8 is schematic drawing illustrating a zoom out cross-sectional view of the semiconductor memory device 10 as shown in FIG. 7. In this embodiment, the middle supporting layer 124 and the upper supporting layer 126 of the semiconductor memory device 10 may be made of different materials. The middle supporting layer 124 has a stress consistent with the substrate 100, and the upper supporting layer 126 has a stress different from the stress of the middle supporting layer 124. For example, in the embodiment shown in FIG. 7 and FIG. 8, the upper supporting layer 126 may have a tensile stress to the substrate 100 along the horizontal direction from the inside of the array region R1 to the peripheral region R2. The tensile stress may cause some of the capacitors 122 near the peripheral region R2 (such as the capacitors 122 on the dummy array region R1-2) bending and respectively having a bending axial lines AXc. More particularly, as shown in FIG. 7, the upper portions 122*a* of some of the capacitors 122 near the peripheral region R2 may lean toward the peripheral region R2 while the lower portions 122*b* may maintain upright vertical to the surface of the substrate 100. As a result, the upper axial lines AX1c are bending and respectively have a curved profile, and the lower axial lines AX2c are straight and respectively have a linear profile. The extending lines AX1-1 along the portions of the upper axial lines AX1c through the upper supporting layer 126 are misaligned from the associated contact pads 104, and the distances of the misalignments may increase as the contact pads 104 are closer to the edge 100*a* of the array region R1. For example, as shown in FIG. 7, the distances between the three outermost contact pads 104 and the edge 100*a* of the array region R1 are D1, D2 and D3, and the distances of the misalignments between the extending lines AX1-1 along the upper axial lines AX1c of the capacitors 122 on the three contact pads 104 near the peripheral region R2 are M1, M2, and M3, wherein M1 is larger than M2, and M2 is larger than M3. In some embodiments, the distance M1 is smaller than the pitch P1 of the contact pads 104 and larger than ½ of the space S1 between sidewalls of adjacent contact pads 104. In some embodiments, the distance M1 is smaller than the pitch P1 of the contact pads 104 and larger than the space S1 between sidewalls of adjacent contact pads 104. As shown in FIG. 8, the capacitor array structures 120 have tilted sidewalls that lean inwardly from tops to bottoms of the capacitor array structures 120, so that the portion of the planarization layer 140 filled between the capacitor array structures 120 may have a trapezoid cross-sectional profile.

Figure 9:
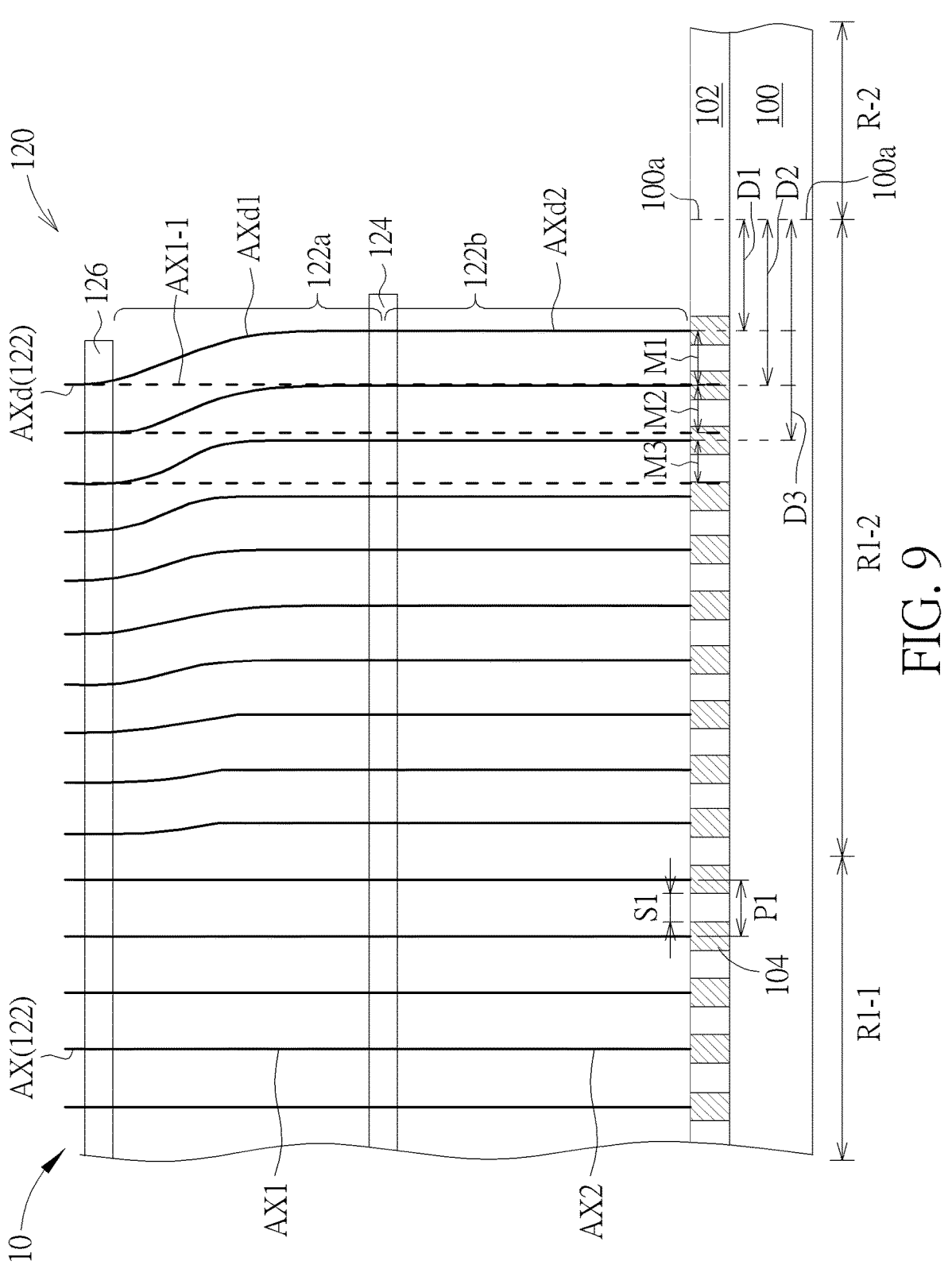
FIG. 9 is a schematic drawing illustrating a partial cross-sectional view of a semiconductor memory device according to an embodiment of the present invention.
Figure 10:
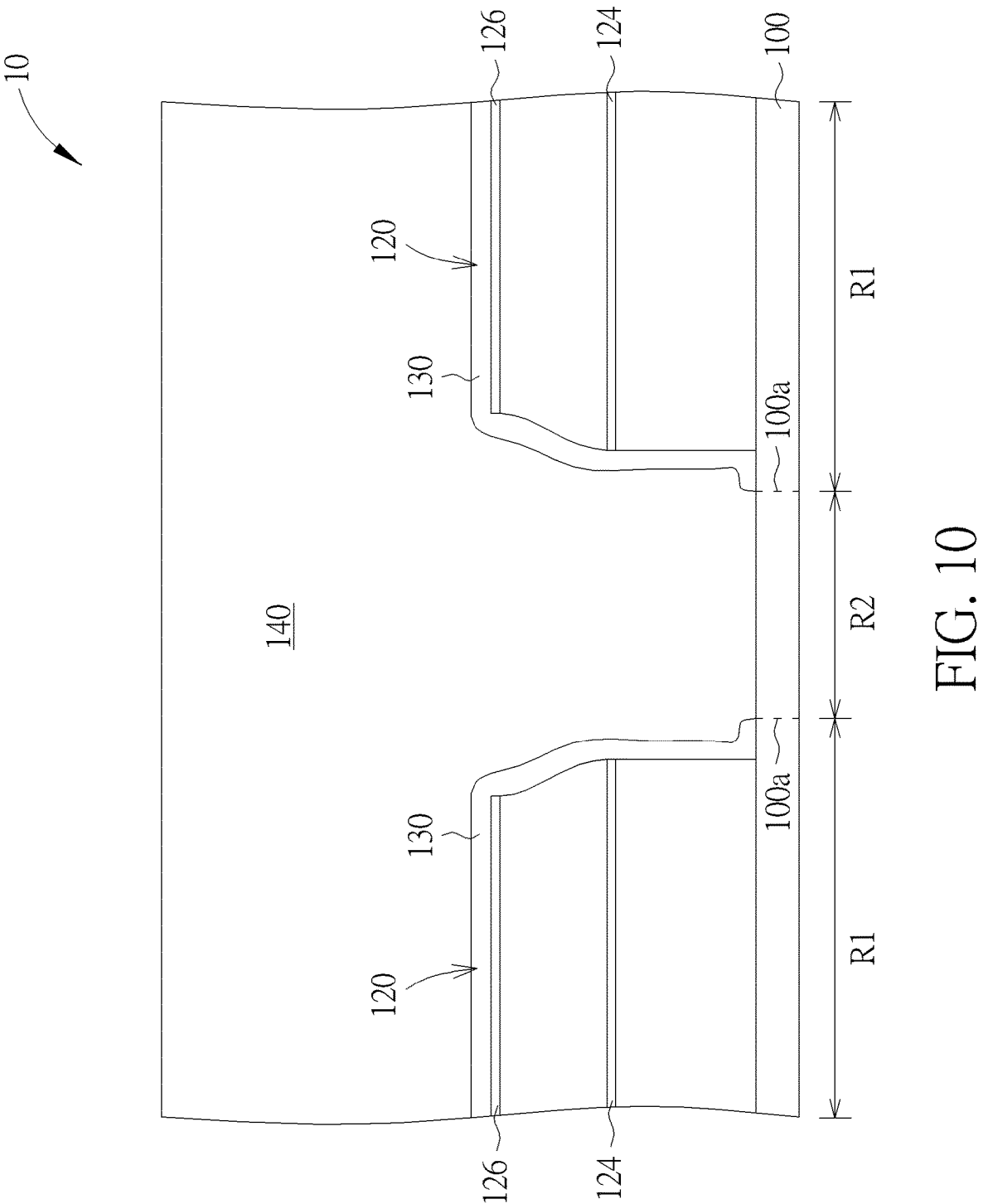
FIG. 10 is schematic drawing illustrating a zoom out cross-sectional view of the semiconductor memory device as shown in FIG. 9.

Please refer to FIG. 9 and FIG. 10. FIG. 9 is a schematic drawing illustrating a partial cross-sectional view of a semiconductor memory device 10 according to an embodiment of the present invention. FIG. 10 is schematic drawing illustrating a zoom out cross-sectional view of the semiconductor memory device 10 as shown in FIG. 9. In this embodiment, the middle supporting layer 124 and the upper supporting layer 126 of the semiconductor memory device 10 may be made of different materials. The middle supporting layer 124 has a stress substantially consistent with the substrate 100, and the upper supporting layer 126 has a stress different from the stress of the middle supporting layer 124. For example, the upper supporting layer 126 may have a compressive stress to the substrate 100 along the horizontal direction from the inside of the array region R1 to the peripheral region R2. The compressive stress may cause some of the capacitors 122 near the peripheral region R2 (such as the capacitors 122 on the dummy array region R1-2) bending and respectively having a bending axial lines AXd. More particularly, as shown in FIG. 9, the upper portions 122a of the capacitors 122 near the peripheral region R2 may lean toward the inner side of the array region R1 while the lower portions 122b may maintain upright vertical to the surface of the substrate 100. As a result, the upper axial lines AXd1 of the capacitors 122 near the peripheral region R2 are bending and respectively have a curved profile, and the lower axial lines AXd2 are straight and respectively have a linear profile. The extending lines AX1-1 along the portions of the upper axial lines AXd1 through the upper supporting layer 126 are misaligned from the associated contact pads 104, and the distances of the misalignments may increase as the contact pad 104 is closer to the edge 100a of the array region R1. For example, as shown in FIG. 9, the distances between the three outermost contact pads 104 and the edge 100a of the array region R1 are D1, D2 and D3, and the distances of the misalignments between the extending lines AX1-1 along the upper axial lines AXd1 of the capacitors 122 on the three contact pads 104 near the peripheral region R2 are M1, M2, and M3, wherein M1 is larger than M2, and M2 is larger than M3. In some embodiments, the distance M1 is smaller than the pitch P1 of the contact pads 104 and larger than ½ of the space S1 between the sidewalls of adjacent contact pads 104. In some embodiments, the distance M1 is smaller than the pitch P1 of the contact pads 104 and larger than the space S1 between sidewalls of adjacent contact pads 104. As shown in FIG. 10, the capacitor array structures 120 have tilted sidewalls that lean outwardly from tops to bottoms of the capacitor array structures 120, so that the portion of the planarization layer 140 filled between the capacitor array structures 120 may have an upside-down trapezoid cross-sectional profile.

In conclusion, the present invention provides a semiconductor memory device including memory cells with stacked capacitors, and the capacitor array structures formed by the stacked capacitors have inward-leaning or outward-leaning sidewalls to reduce the stress in the capacitor array structures. Furthermore, the portion of the planarization layer filled between the capacitor array structures may have a cross-sectional profile corresponding to the profile of the sidewalls of the capacitor array structures, such as a trapezoid or upside-down trapezoid cross-sectional profile. This may further improve the overall stress state of the semiconductor memory device, so that stress-induced damages in the capacitor array structures may be reduced and better device reliability may be obtained. It should be noted that the approaches to make the tilted edge capacitors by the stresses of the supporting layers are examples and are not limitation to the present invention. Other approaches such as controlling the etching process to form tilted bottom electrode holes, controlling patterns of the supporting layers to generate desired regional stress, adjusting stress of the top electrode by controlling deposition rates, or controlling temperature curve of the anneal process after deposition of the top electrode to generate desired stress are also applicable in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate comprising at least an array region;
a peripheral region bordering an edge of the array region;
a plurality of contact pads disposed on the array region; and
a capacitor array structure disposed on the array region, and comprising:
a plurality of capacitors respectively disposed on the contact pads; and
a middle supporting layer extending laterally between waist portions of the capacitors to define an upper portion and a lower portion of each of the capacitors, wherein the lower portions of the capacitors near the edge of the array region are tilted, and the upper portions of the capacitors near the edge of the array region have misalignments to the contact pads, wherein distances of the misalignments are larger as the capacitors closer to the edge of the array region.

2. The semiconductor memory device according to claim 1, wherein distances of the misalignments are smaller than a pitch of the contact pads and larger than ½ of a space between sidewalls of the contact pads.

3. The semiconductor memory device according to claim 1, wherein upper axial lines of the upper portions of the capacitors near the edge of the array region are straight and perpendicular to a surface of the substrate.

4. The semiconductor memory device according to claim 1, wherein lower axial lines of the lower portions of the capacitors near the edge of the array region are bending.

5. The semiconductor memory device according to claim 1, further comprising an upper supporting layer extending laterally between top portions of the capacitors.

6. The semiconductor memory device according to claim 5, wherein the middle supporting layer and the upper supporting layer are made of a same material and comprise a same stress.

7. The semiconductor memory device according to claim 1, wherein the substrate comprises another array region at a side of the peripheral region opposite to the array region, the semiconductor memory device further comprises:
another capacitor array structure disposed on the another array region; and a planarization layer on the substrate and filling a space between the capacitor array structure and the another capacitor array structure.

8. The semiconductor memory device according to claim 7, wherein a portion of the planarization layer between the capacitor array structure and the another capacitor array structure have a trapezoid cross-sectional profile.

9. A semiconductor memory device, comprising:
a substrate comprising at least an array region;
a peripheral region bordering an edge of the array region;
a plurality of contact pads disposed on the array region; and
a capacitor array structure disposed on the array region, and comprising:
a plurality of capacitors respectively disposed on the contact pads; and
a middle supporting layer extending laterally between waist portions of the capacitors to define an upper portion and a lower portion of each of the capacitors, wherein the upper portions of the capacitors near the edge of the array region are tilted and have misalignments to the contact pads, wherein distances of the misalignments are larger as the capacitors closer to the edge of the array region.

10. The semiconductor memory device according to claim 9, wherein distances of the misalignments are smaller than a pitch of the contact pads and larger than $\frac{1}{2}$ of a space between sidewalls of the contact pads.

11. The semiconductor memory device according to claim 9, wherein lower axial lines of the lower portions of the capacitors near the edge of the array region are straight and perpendicular to a surface of the substrate.

12. The semiconductor memory device according to claim 9, wherein upper axial lines of the upper portions of the capacitors near the edge of the array region are bending.

13. The semiconductor memory device according to claim 9, further comprising an upper supporting layer extending laterally between top portions of the capacitors.

14. The semiconductor memory device according to claim 13, wherein the middle supporting layer and the upper supporting layer are made of different materials and comprise different stresses.

15. The semiconductor memory device according to claim 9, wherein the substrate comprises another array region at a side of the peripheral region opposite to the array region, the semiconductor memory device further comprises:
another capacitor array structure disposed on the another array region; and
a planarization layer covering the substrate in a blanket manner and filling a space between the capacitor array structure and the another capacitor array structure.

16. The semiconductor memory device according to claim 15, wherein a portion of the planarization layer between the capacitor array structure and the another capacitor array structure have a trapezoid cross-sectional profile.

17. A semiconductor memory device, comprising:
a substrate comprising at least an array region;

a peripheral region bordering an edge of the array region;
a plurality of contact pads disposed on the array region; and
a capacitor array structure disposed on the array region, and comprising:
a plurality of capacitors respectively disposed on the contact pads; and
a middle supporting layer extending laterally between waist portions of the capacitors to define an upper portion and a lower portion of each of the capacitors, wherein the lower portions of the capacitors near the edge of the array region are tilted, and the upper portions of the capacitors near the edge of the array region have misalignments to the contact pads, wherein distances of the misalignments are smaller than a pitch of the contact pads and larger than $\frac{1}{2}$ of a space between sidewalls of the contact pads.

18. The semiconductor memory device according to claim 17, wherein upper axial lines of the upper portions of the capacitors near the edge of the array region are straight and perpendicular to a surface of the substrate.

19. The semiconductor memory device according to claim 17, wherein lower axial lines of the lower portions of the capacitors near the edge of the array region are bending.

20. The semiconductor memory device according to claim 17, further comprising an upper supporting layer extending laterally between top portions of the capacitors.

21. A semiconductor memory device, comprising:
a substrate comprising at least an array region;
a peripheral region bordering an edge of the array region;
a plurality of contact pads disposed on the array region; and
a capacitor array structure disposed on the array region, and comprising:
a plurality of capacitors respectively disposed on the contact pads; and
a middle supporting layer extending laterally between waist portions of the capacitors to define an upper portion and a lower portion of each of the capacitors, wherein the upper portions of the capacitors near the edge of the array region are tilted and have misalignments to the contact pads, wherein distances of the misalignments are smaller than a pitch of the contact pads and larger than $\frac{1}{2}$ of a space between sidewalls of the contact pads.

22. The semiconductor memory device according to claim 21, wherein lower axial lines of the lower portions of the capacitors near the edge of the array region are straight and perpendicular to a surface of the substrate.

23. The semiconductor memory device according to claim 21, wherein upper axial lines of the upper portions of the capacitors near the edge of the array region are bending.

24. The semiconductor memory device according to claim 21, further comprising an upper supporting layer extending laterally between top portions of the capacitors.

* * * * *